United States Patent
Andry et al.

(10) Patent No.: US 9,209,128 B2
(45) Date of Patent: Dec. 8, 2015

(54) INTEGRATED CIRCUIT ASSEMBLY WITH CUSHION POLYMER LAYER

(71) Applicants: International Business Machines Corporation, Armonk, NY (US); Hitachi Chemical DuPont Microsystems, L.L.C., Parlin, NJ (US)

(72) Inventors: Paul S. Andry, Yorktown Heights, NY (US); Sarah H. Knickerbocker, Hopewell Junction, NY (US); Ron R. Legario, New Brunswick, NJ (US); Cornelia K. Tsang, Mohegan Lake, NY (US); Melvin P. Zussman, Wilmington, DE (US)

(73) Assignees: International Business Machines Corporation, Armonk, NY (US); HITACHI CHEMICAL DUPONT MICROSYSTEMS, L.L.C., Parlin, NJ (US)

( * ) Notice: Subject to any disclaimer, the term of this patent is extended or adjusted under 35 U.S.C. 154(b) by 0 days.

(21) Appl. No.: 14/231,816

(22) Filed: Apr. 1, 2014

(65) Prior Publication Data
US 2015/0279779 A1    Oct. 1, 2015

(51) Int. Cl.
| | |
|---|---|
| H01L 21/20 | (2006.01) |
| H01L 21/4763 | (2006.01) |
| H01L 21/44 | (2006.01) |
| H01L 23/522 | (2006.01) |
| H01L 23/528 | (2006.01) |
| H01L 23/532 | (2006.01) |
| H01L 21/768 | (2006.01) |
| H01L 21/3105 | (2006.01) |
| H01L 21/02 | (2006.01) |

(52) U.S. Cl.
CPC ...... *H01L 23/5226* (2013.01); *H01L 21/02118* (2013.01); *H01L 21/02274* (2013.01); *H01L 21/31055* (2013.01); *H01L 21/76802* (2013.01); *H01L 21/76877* (2013.01); *H01L 23/528* (2013.01); *H01L 23/5329* (2013.01); *H01L 23/53228* (2013.01)

(58) Field of Classification Search
CPC ............ H01L 23/3128; H01L 23/5226; H01L 2224/13
USPC .................................... 438/625–641
See application file for complete search history.

(56) References Cited

U.S. PATENT DOCUMENTS

| | | | |
|---|---|---|---|
| 8,450,197 B2* | 5/2013 | Preusse et al. ............... | 438/625 |
| 8,957,526 B2* | 2/2015 | Chun et al. ................... | 438/629 |
| 2012/0256313 A1 | 10/2012 | Guerin et al. | |
| 2013/0015579 A1 | 1/2013 | Guerin et al. | |
| 2013/0147032 A1 | 6/2013 | Jeng et al. | |

* cited by examiner

*Primary Examiner* — Cuong Q Nguyen
(74) *Attorney, Agent, or Firm* — Cantor Colburn LLP; Steven Meyers

(57) ABSTRACT

A method of forming an integrated circuit assembly includes forming an insulator layer on a preliminary semiconductor assembly. The preliminary semiconductor assembly includes a semiconductor substrate having a first side and a second side opposite the first side, a semiconductor circuitry layer formed on the first side of the semiconductor substrate, and a conductive via extending through the semiconductor substrate from the semiconductor circuitry layer to the second side. The insulator is formed on the second side and an end of the conductive via. The method includes forming a polymer layer on the insulator layer, removing a quantity of the polymer layer sufficient to expose the end of the conductive via through the insulator layer, and forming a conductive contact on the polymer layer and the end of the conductive via.

10 Claims, 11 Drawing Sheets

INTEGRATED CIRCUIT ASSEMBLY WITH CUSHION POLYMER LAYER

BACKGROUND

The present disclosure relates to semiconductor devices, and in particular to an integrated circuit assembly having a cushion polymer layer.

Integrated circuits are typically formed by forming semiconductor circuitry on a silicon substrate. During the manufacturing process, a handle layer may be attached to the semiconductor circuitry via an adhesive. In some circuits, through-silicon vias (TSVs) are formed in the silicon substrate to connect the semiconductor circuitry on one side of the silicon substrate with electrical connectors on the opposite side of the silicon substrate. An insulator layer is typically formed around the conductor of the TSVs and on the back side of the silicon substrate to prevent diffusion of metals into the silicon substrate.

During manufacturing, and testing, the integrated circuit device is subjected to stresses, including physical stresses caused by physically and electrically connecting contacts on the back side of the silicon substrate to other devices, by planarizing or polishing the back side of the silicon substrate, or by other processes. These stresses may cause flaws to appear in one or more of the TSVs, the dielectric layer around the TSVs, the dielectric layer formed on the back side of the silicon substrate, and the metal contacts that connect the TSVs to other devices. These flaws may result in electrical failures of the integrated circuit device.

SUMMARY

Embodiments of the invention include a method of forming an integrated circuit assembly. The method includes forming an insulator layer on a preliminary semiconductor assembly. The preliminary semiconductor assembly includes a semiconductor substrate having a first side and a second side opposite the first side, a semiconductor circuitry layer formed on the first side of the semiconductor substrate, and a conductive via extending through the semiconductor substrate from the semiconductor circuitry layer to the second side. The insulator is formed on the second side and an end of the conductive via. The method includes forming a polymer layer on the insulator layer, removing a quantity of the polymer layer sufficient to expose the end of the conductive via through the insulator layer, and forming a conductive contact on the polymer layer and the end of the conductive via.

Additional embodiments include an integrated circuit assembly including a silicon substrate having a first side and a second side opposite the first side and a semiconductor circuitry layer on the first side of the silicon substrate. The assembly includes a conductive via extending through the silicon substrate from the semiconductor circuitry layer to the second side of the silicon substrate, an insulator layer on the second side of the silicon substrate, and a polymer layer on the insulator layer. The assembly further includes a metal contact on an end of the conductive via and on the polymer layer around the end of the conductive via.

Additional features and advantages are realized through the techniques of the present disclosure. Other embodiments and aspects of the present disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter of the disclosure is particularly pointed out and distinctly claimed in the claims at the conclusion of the specification. The forgoing and other features, and advantages of the disclosure are apparent from the following detailed description taken in conjunction with the accompanying drawings in which:

DETAILED DESCRIPTION

Conventional integrated circuit devices are subject to failures resulting from physical stresses applied to the integrated circuit during manufacturing. Embodiments of the invention relate to forming a photo-imageable polymer cushion layer on a silicon substrate.

Figure 1:
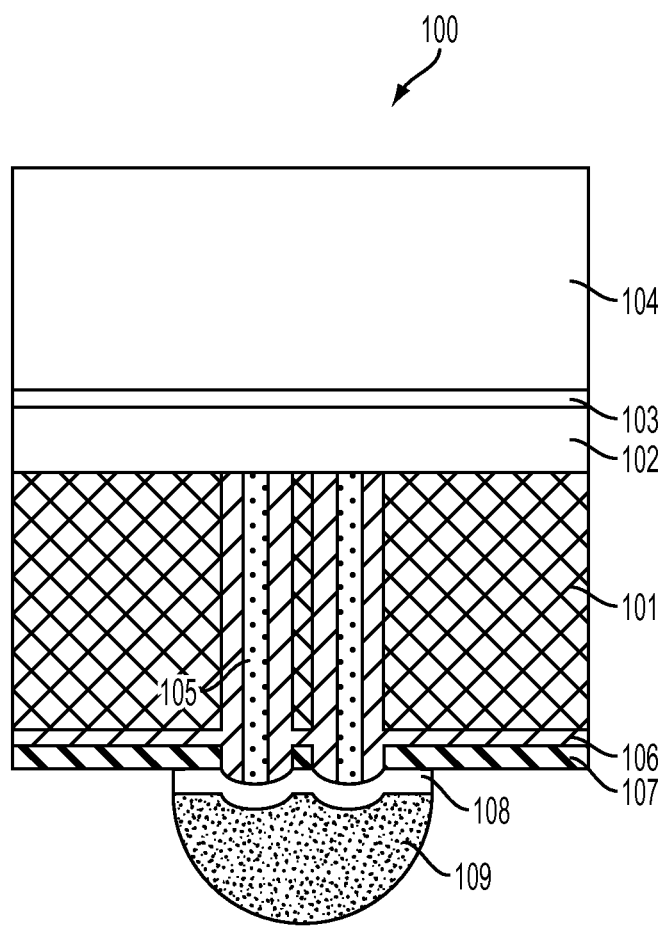
FIG. 1 illustrates an integrated circuit assembly according to an embodiment of the invention.

FIG. 1 illustrates an integrated circuit assembly 100 according to an embodiment of the invention. The assembly 100 includes a silicon substrate 101, a semiconductor circuitry layer 102 formed on the silicon substrate 101, an adhesive layer 103 formed on the semiconductor circuitry layer 102, and a handle layer 104 attached to the semiconductor circuitry layer 102 by the adhesive layer 103. The semiconductor circuitry layer 102 may include transistor circuitry, wiring, and any other circuitry. In one embodiment, the adhesive layer 103 breaks down at a temperature around 350 degrees Celsius, such as between 330 degrees Celsius and 370 degrees Celsius. In one embodiment, the handle layer 104 is glass.

It should be understood that FIG. 1 and the subsequent FIGS. 2-11 are not intended to be drawn to scale, but instead are provided to emphasize particular features of the invention. For example, in one embodiment the silicon substrate 101 has a thickness of around 50 micrometers (μm) and the handle layer 104 has a thickness of around 700 μm.

Conductive vias 105, or through-silicon vias (TSVs) extend through the silicon substrate 101 from the semiconductor circuitry layer 102 on a first side of the silicon substrate 101 to a second side of the silicon substrate 101 opposite the first side. An insulator layer 106 surrounds the conductive vias 105 and is also deposited on the second side of the silicon substrate 101. In one embodiment, the insulator layer 106 is one of an oxide layer and a nitride layer. A polymer layer 107 is located on the insulator layer 106. A metal contact 108 is formed on an end of the conductive via 105 and on the polymer layer 107 to be electrically connected to the conductive via 105. A solder contact 109 is illustrated on the metal contact 108.

In embodiments of the invention, the polymer layer 107 may act as a stress buffer. In one embodiment, the polymer layer 107 is has a curing temperature in a range between around 260 degrees Celsius and 320 degrees Celsius. In particular, in one embodiment, the polymer layer 107 has a curing temperature less than a breakdown temperature of the adhesive layer 103. In one embodiment, the polymer layer is photoimageable or photo-patternable polybenzoxazole (PBO). In one embodiment, the insulator layer 106 is a hard dielectric formed by plasma-enhanced chemical vapor deposition, and the polymer layer 107 is compliant relative to a hardness of the insulator layer 106. In embodiments of the invention, the material that makes up the polymer layer 107 is polish-able to reduce the thickness of the polymer layer 107.

Figure 2:
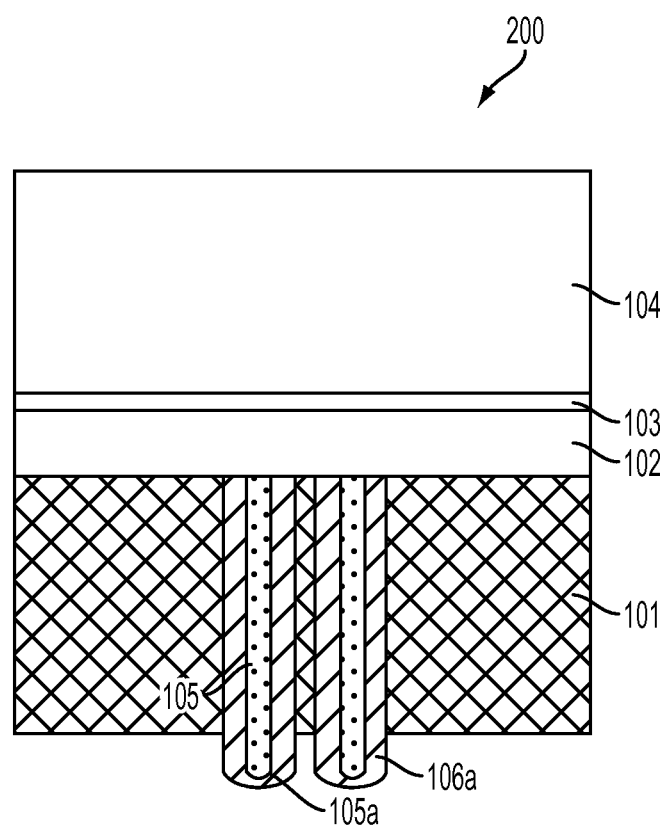
FIG. 2 illustrates a preliminary semiconductor assembly according to an embodiment of the invention.

FIGS. 2-6 describe a method of forming the integrated circuit assembly 100 according to an embodiment of the invention. In FIG. 2, a preliminary or interim integrated circuit structure 200 is provided. The preliminary integrated circuit structure 200 includes the silicon substrate 101, the semiconductor circuitry layer 102, the adhesive layer 103, and the handle layer 104. The conductive vias 105 are formed in the silicon substrate 101 to extend through the silicon substrate 101. Ends 105a of the conductive vias extend outward from the surface of the silicon substrate 101. In one embodiment, the conductive vias 105 are formed to extend outward from the silicon substrate 101 by a deep reactive-ion etching process of the silicon substrate 101.

An insulator layer 106a surrounds the conductive vias 105 in the silicon substrate 101 and covers the ends of the conductive vias 105a that extend outward from the silicon substrate 101. In one embodiment, the insulator layer 106a is a hard dielectric formed by plasma-enhanced chemical vapor deposition. In one embodiment, the insulator layer 106a is one of an oxide and a nitride layer.

In one embodiment, the preliminary integrated circuit structure 200 is formed by depositing the adhesive layer 103 on the semiconductor circuitry layer 102 and pressing the handle layer 104 onto the adhesive layer 103. In one embodiment, the handle layer 104 is glass.

Figure 3:
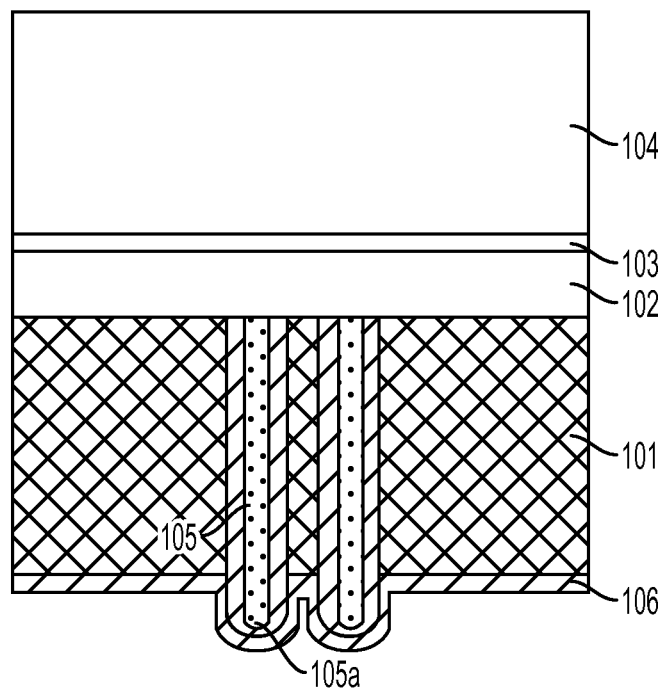
FIG. 3 illustrates forming an insulating layer on the preliminary semiconductor assembly.

FIG. 3 illustrates depositing the insulator layer 106 on the silicon substrate 101 and the ends of the conductive vias 105. In one embodiment, the insulator layer 106a is a hard dielectric formed by plasma-enhanced chemical vapor deposition. In one embodiment, the insulator layer 106a is one of an oxide and a nitride layer.

Figure 4:
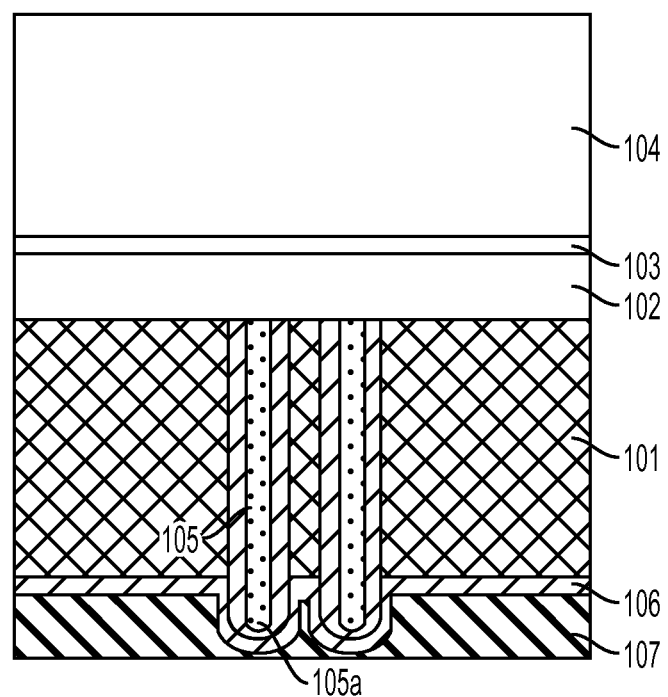
FIG. 4 illustrates forming a polymer layer according to an embodiment of the invention.

FIG. 4 illustrates forming the polymer layer 107 on the insulator layer 106 over the silicon substrate 101 and the ends 105a of the conductive vias 105. In one embodiment, the polymer layer 107 is has a curing temperature in a range between around 260 degrees Celsius and 320 degrees Celsius. In particular, in one embodiment, the polymer layer 107 has a curing temperature less than a breakdown temperature of the adhesive layer 103. In one embodiment, the polymer layer is PBO.

In embodiments of the invention, the polymer layer 107 acts as a cushion layer. In particular, the polymer layer 107 may have a Young's modulus in a range between 2-4 gigapascals (GPa), and a tensile strength around 300 megapascals (MPa).

Figure 5:
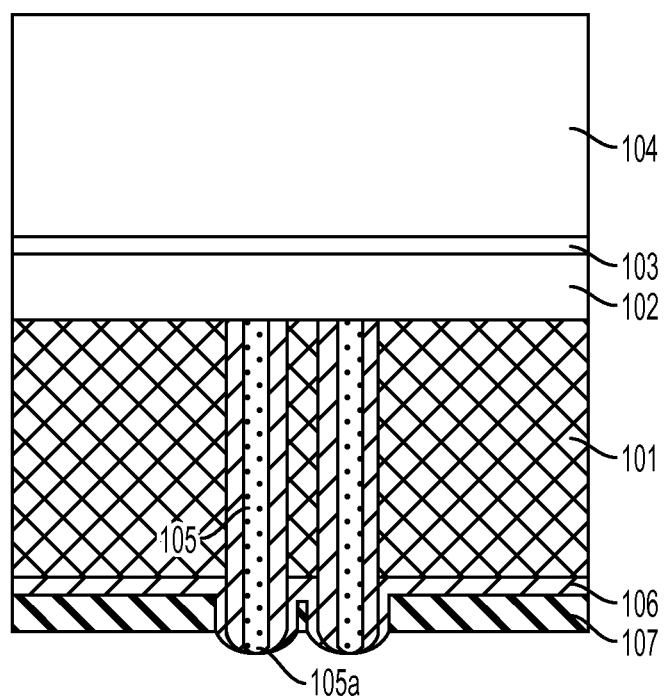
FIG. 5 illustrates removing a portion of the polymer layer.

FIG. 5 illustrates removing a portion of the polymer layer 107 to expose the ends 105a of the conductive vias 105. In one embodiment, the polymer layer 107 is thinned by polishing the surface of the polymer layer 107. Accordingly, in such an embodiment the polymer layer 107 must be made of a material that is capable of being polished. The polishing may be chemical-mechanical polishing or chemical-mechanical planarization (CMP), for example.

As a result of the polishing or planarization, the ends 105a of the conductive vias 105 are exposed. The polymer layer 107 may be polished to be even with the ends 105a of the conductive vias 105, or, as illustrated in FIG. 5, the ends 105a may protrude slightly from the polymer layer 107.

Figure 6:
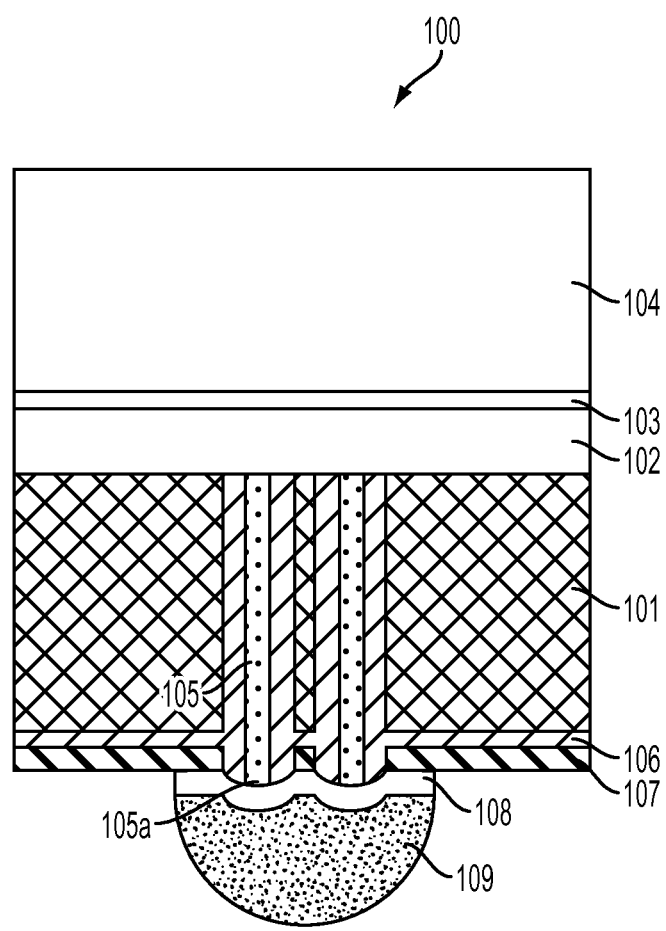
FIG. 6 illustrates forming a metal contact on the polymer layer.

FIG. 6 illustrates forming a metal contact 108 on the ends 105a of the conductive vias 105 and the polymer layer 107. The center of the metal contact 108 may be formed over the ends 105a of the conductive vias 105, and the edges of the metal contact 108 may cover the polymer layer 107. The metal contact 108 may be made of any conductive metal, and in particular, may be a conductive metal having a high adhesion value, or being capable of adhering to the polymer layer 107. Examples of metals include chromium, titanium, copper and tungsten. A solder contact 109 is formed on the metal contact 108. The solder contact 109 may be physically and electrically connected to neighboring electrical devices.

In embodiments of the invention, the metal contact 108 is formed on the ends 105a of the conductive vias 105 and on the polymer layer 107. The polymer layer 107 acts as a cushion layer to provide a physical cushion for the metal contact 108, such that when physical forces or stresses are applied to the metal contact 108, the polymer layer 107 provides a cushion to the metal contact 108. For example, the cushion characteristic of the polymer layer 107 protects the dielectric shell, or insulator layer 106a, around the conductive vias 105 from cracking when stresses are applied to the conductive via 105, such as by mounting the integrated circuit assembly 100 to another device, performing polishing or planarizing of the polymer layer 107, or any other physical or thermal process that may introduce stress to the conductive vias 105.

In one embodiment, the metal contact 108 is formed on the ends 105a of the conductive vias 105 and on the polymer layer 107 immediately after polishing or planarizing the polymer layer 107 without any intervening steps or operations, such as without forming a passivation overcoat. In one embodiment the metal contact 108 is formed by plating, and the solder contact 109 may also be formed by a plating process.

Figure 7:
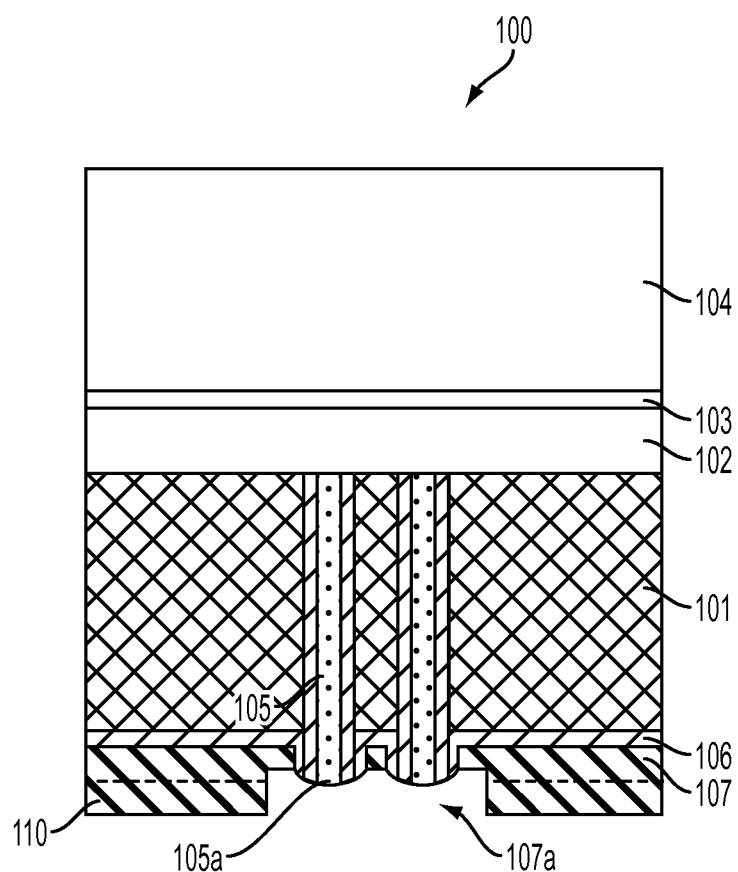
FIG. 7 illustrates forming an addition to the polymer layer.

FIGS. 7-11 illustrate another embodiment in which the polymer layer 107 includes wiring layers embedded within the polymer layer 107. Referring to FIGS. 5-7, instead of adding the metal contact 108 of FIG. 6 onto the ends 105a of the conductive vias 105 and the polymer layer 107, a polymer addition layer 110 is added to the polymer layer 107. The polymer addition layer 110 is patterned to leave the ends 105a of the conductive vias 105 exposed, resulting in a recess 107a in the polymer layer 107, with the ends 105a of the conductive vias 105 located at the base of the recess 107a, or extending from the base of the recess 107a. The polymer addition layer 110 may be patterned by photo-imaging, masking, or any other patterning or etching process capable of patterning the polymer material of the polymer layer 107 and the polymer addition layer 110.

Figure 8:
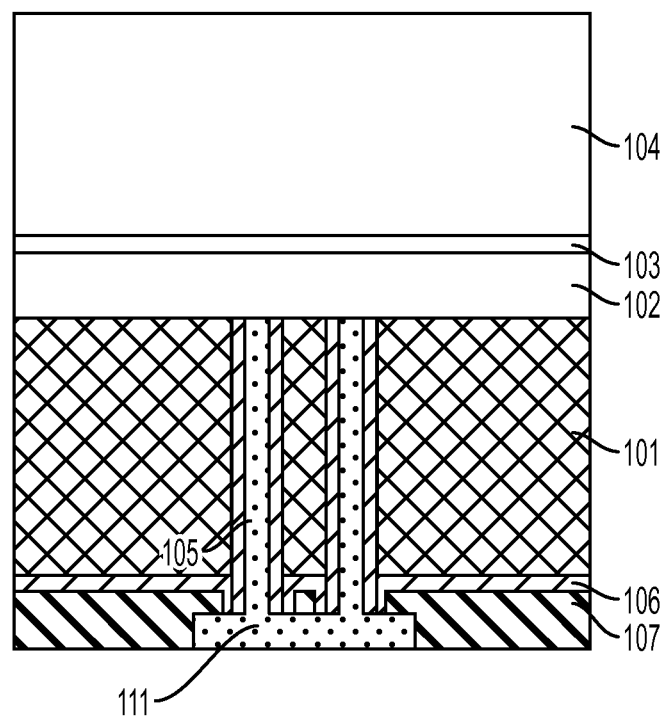
FIG. 8 illustrates filing a recess in the polymer layer with a conductive material.
Figure 9:
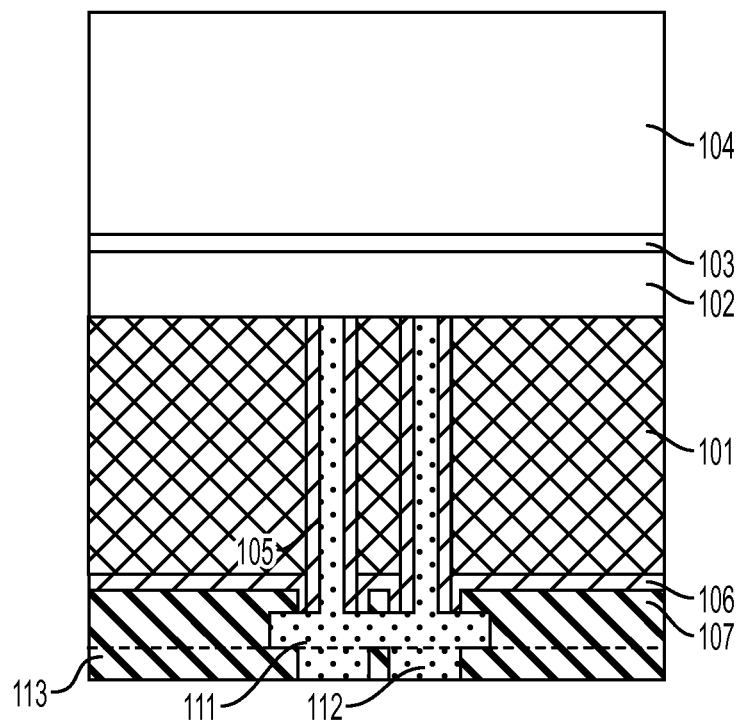
FIG. 9 illustrates forming another addition to the polymer layer and forming wiring in the polymer layer.
Figure 10:
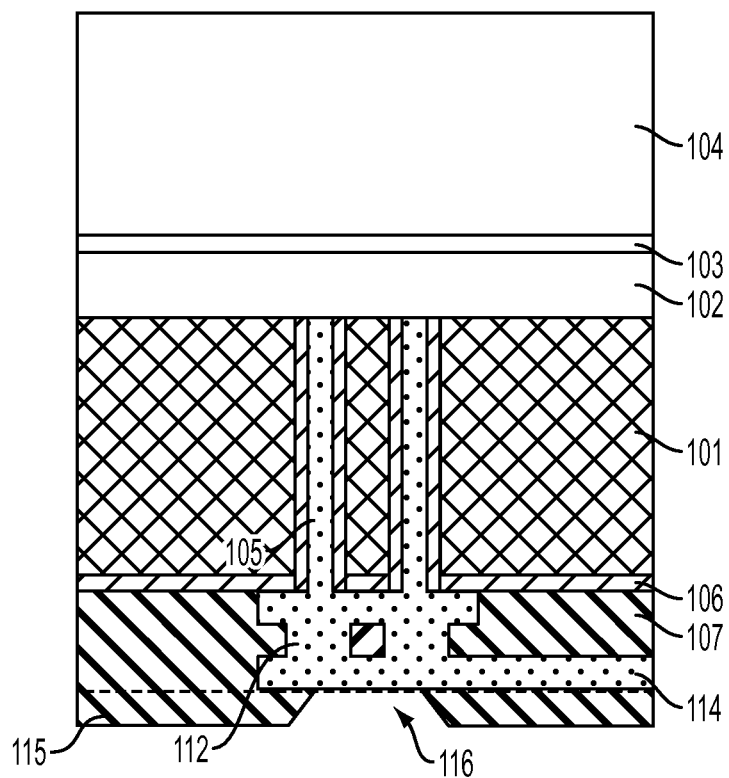
FIG. 10 illustrates forming another addition to the polymer layer on the wiring layer.

FIG. 8 illustrates filling the recess 107a with a conductor 111, such as copper. The conductor 111 may be provided by any process, such as a plating process or any other metal deposition process. FIG. 9 illustrates forming another polymer addition layer 113 onto the polymer layer 107 and forming additional conductive contacts 112 in spaces formed in the polymer addition layer 113. The conductive contacts 112 may be formed by a plating process or any other deposition process. FIG. 10 illustrates forming a wiring layer 114 on the conductive contacts 112, and forming another polymer addition layer 115 on the polymer layer 107 and the wiring layer 114. The wiring layer 114 may be formed by a plating process or any other metal deposition process. A recess 116 is formed in the polymer addition layer 115.

Figure 11:
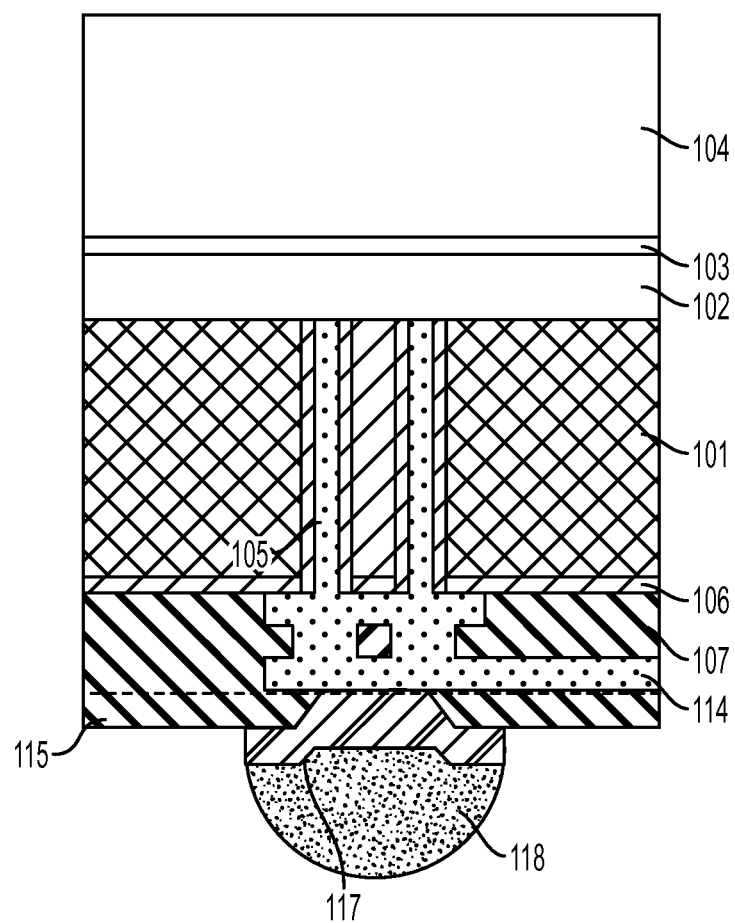
FIG. 11 illustrates forming a metal contact on the wiring layer and the polymer layer according to one embodiment of the invention.

FIG. 11 illustrates forming a metal contact 117 in the recess 116 and forming a solder contact 118 on the metal contact 117. The center of the metal contact 117 may be formed over the ends 105a of the conductive vias 105, and the edges of the metal contact 108 may cover the polymer layer 107. The metal contact 108 may be made of any conductive metal, and in particular, may be a conductive metal having a high adhesion value, or being capable of adhering to the polymer layer 107. Examples of metals include chromium, titanium, copper and tungsten. In one embodiment the metal contact 117 is formed by plating, and the solder contact 118 may also be formed by a plating process.

In embodiments of the invention, the metal contact 117 is formed over the ends 105a of the conductive vias 105, contacting a wiring layer 114 embedded in the polymer layer 107. The metal contact 117 is also formed on the polymer layer 107. The polymer layer 107 acts as a cushion layer to provide a physical cushion for the metal contact 117, such that when physical forces or stresses are applied to the metal contact 117, the polymer layer 107 provides a cushion to the metal contact 117.

Embodiments of the invention relate to forming a cushion polymer layer on a back side of a silicon substrate of an integrated circuit assembly. The silicon substrate has conductive vias extending through the silicon substrate to extend from the back side of the silicon substrate. A metal contact may be formed directly on the ends of the conductive via and on the polymer layer. Alternatively, the polymer layer may include embedded wiring layers and the metal contact may contact the embedded wiring layers and the polymer layer, and the embedded wiring layers may contact the ends of the conductive vias. The polymer layer is selected to have a curing temperature less than a breakdown temperature of an adhesive layer that attaches a handle layer to the silicon substrate to permit the polymer layer to be formed prior to manufacturing processes that introduce mechanical, electrical, and temperature stresses to the integrated circuit assembly. The polymer layer provides a cushion to the metal contact to reduce stress on the metal contact, on the conductive via, and on a dielectric layer surrounding the conductive via.

The terminology used herein is for the purpose of describing particular embodiments only and is not intended to be limiting of the invention to the particular embodiments described. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosed embodiments. Many modifications and variations will be apparent to those of ordinary skill in the art without departing from the scope and spirit of the embodiments of the present disclosure.

While preferred embodiments have been described above, it will be understood that those skilled in the art, both now and in the future, may make various improvements and enhancements which fall within the scope of the claims which follow.

What is claimed is:

1. A method of forming an integrated circuit assembly, comprising:
    forming an insulator layer on a preliminary semiconductor assembly comprising a semiconductor substrate having a first side and a second side opposite the first side, a semiconductor circuitry layer formed on the first side of the semiconductor substrate, and a conductive via extending through the semiconductor substrate from the semiconductor circuitry layer to the second side, the insulator being formed on the second side and an end of the conductive via,
    forming a polymer layer on the insulator layer;
    removing a quantity of the polymer layer sufficient to expose the end of the conductive via through the insulator layer; and
    forming a conductive contact on the polymer layer and the end of the conductive via.

2. The method of claim 1, wherein the polymer has a curing temperature in a range from about 260 degrees Celsius to about 320 degrees Celsius, and the method further comprises curing the polymer at a temperature in the range from about 260 degrees Celsius to about 320 degrees Celsius.

3. The method of claim 1, further comprising:
    forming an adhesive layer on the semiconductor circuitry layer; and
    forming a handle layer on the adhesive layer,
    wherein the curing temperature of the polymer layer is less than a breakdown temperature of the adhesive layer.

4. The method of claim 1, wherein removing the quantity of polymer layer sufficient to expose the end of the conductive via includes chemical-mechanical polishing of the polymer layer.

5. The method of claim 1, wherein the polymer layer is photoimageable polybenzoxazole.

6. The method of claim 1, wherein the conductive via is formed to extend outward from the second side of the silicon substrate, the insulator layer formed over covering a surface of the conductive via, and
    removing the quantity of the polymer layer sufficient to expose the end of the conductive via includes removing a portion of the conductive via that extends outward from the second surface of the silicon substrate.

7. The method of claim 6, wherein the conductive via is formed to extend outward from the second surface of the silicon substrate by deep reactive-ion etching of the silicon substrate.

8. The method of claim 1, wherein:
    the insulator layer is a hard dielectric formed by plasma-enhanced chemical vapor deposition; and
    the polymer layer is compliant relative to a hardness of the insulator layer.

9. The method of claim 1, wherein forming the conductive contact on the polymer layer comprises forming multiple wiring layers in the polymer layer.

10. The method of claim 9, wherein forming the multiple wiring layers in the polymer layer comprises:
    forming a first polymer addition layer around the end of the conductive via such that the end of the conductive via is located in a recess formed in the polymer layer;
    filling the recess with a conductor;
    forming a conductive wiring layer on the conductor; and patterning a second polymer addition layer onto the wiring layer to expose a portion of the conductive wiring layer, wherein the conductive contact is formed on the exposed portion of the conductive wiring layer.

* * * * *